(12) United States Patent
Daudin et al.

(10) Patent No.: US 7,354,619 B2
(45) Date of Patent: Apr. 8, 2008

(54) PROTECTION OF THE SIC SURFACE BY A GAN LAYER

(75) Inventors: Bruno Daudin, La Tronche (FR); Julien Brault, Nice (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/944,053

(22) Filed: Sep. 20, 2004

(65) Prior Publication Data

US 2005/0202284 A1 Sep. 15, 2005

(30) Foreign Application Priority Data

Sep. 22, 2003 (FR) .................................. 03 50585

(51) Int. Cl.
*B05D 3/02* (2006.01)
*C23C 16/00* (2006.01)

(52) U.S. Cl. .................. 427/154; 427/255.11; 427/294; 427/350

(58) Field of Classification Search ................ 427/154, 427/350, 255.4, 255.7, 255.11, 294
See application file for complete search history.

(56) References Cited

U.S. PATENT DOCUMENTS 6,001,173 A * 12/1999 Bestwick et al. ............. 117/89
6,380,050 B1 * 4/2002 Wang et al. .................. 438/478
6,670,705 B1 * 12/2003 Harris et al. ................. 257/702

OTHER PUBLICATIONS

M. A. L. Johnson, et al., "MBE Growth and Properties of GaN on GaN/SiC Substrates", Solid-State Electronics, vol. 41, No. 2, XP-004033811, Feb. 1, 1997, pp. 213-218.
K. H. Ploog, et al., "Growth of High-Quality (Al, Ga) N and (Ga, In)N Heterostructures on SIC (0001) by Both Plasma-Assisted and Reactive Molecular Beam Epitaxy", Journal of Vacuum Science and Technology B, vol. 18, No. 4, XP-002284692, Jul. and Aug. 2000, pp. 2290-2294.
L. X. Zheng, et al., "Adsorption and Desorption Kinetics of Gallium Atoms on 6H-SiC(0001) Surfaces", Physical Review B, vol. 61, No. 7, XP-002284693, Feb. 15, 2001, pp. 4890-4893.

* cited by examiner

*Primary Examiner*—Kirsten Jolley
(74) *Attorney, Agent, or Firm*—Oblon, Spivak, McClelland, Maier & Neustadt, P.C.

(57) ABSTRACT

The invention relates to a process for protecting the surface of an SiC substrate. This process comprises deposition of a temporary protection layer with a thickness equal to at least two monolayers on the surface of the substrate to be protected, the protection layer being composed of gallium nitride. Advantageously, the protection layer of gallium nitride may be obtained by depositing gallium on the surface of the substrate, followed by nitridation of the gallium layer formed.

The invention also relates to an "epiready" substrate. This substrate comprises an SiC substrate for which at least one surface is covered by a temporary protection layer, the said layer being composed of GaN and being two monolayers thick.

12 Claims, No Drawings

PROTECTION OF THE SIC SURFACE BY A GAN LAYER

TECHNICAL DOMAIN

This invention relates to a process for protecting the surface of an SiC substrate.

STATE OF PRIOR ART

Nitride semiconductors are very frequently used in the field of microelectronics to obtain transistors, lasers, light emitting diodes, detectors within a range of wavelengths varying from the infrared to the ultra-violet.

These semi-conducting nitrides, for example such as GaN, AlN, InN, and their ternary or quaternary alloys are usually made by epitaxy of nitrides on a support substrate. SiC substrates are widely used as a support for epitaxial growth of semi-conducting nitrides since they have an appropriate crystallographic structure, with a relatively weak lattice mismatch and good thermal conductivity that is useful in power applications.

Regardless of the chosen epitaxial growth mode, for example Molecular Beam Epitaxy (MBE) or MetalOrganic Chemical Vapour Deposition (MOCVD), the substrate used as a support must necessarily be chemically prepared before it is inserted into the epitaxy chamber. This chemical preparation generally consists of cleaning the surface of the said support, followed by chemical etching with different acids, particularly HF, to eliminate the native oxide present on its surface.

However, even after this chemical treatment, the SiC substrate still has traces of oxide on the surface.

One process for removing these oxide traces consists of exposing the surface of the SiC substrate to a hot Gallium jet (700-730° C.), and then repeating this operation putting the substrate under vacuum. The surface of the SiC substrate can be "cleaned" by repeating this cycle enough times. The substrate then has a $\sqrt{3}\times\sqrt{3}$ structure characteristic of a clean unoxidised SiC surface (see K. H. Ploog et al., J. Vac. Sci. Technol., B18(4) p. 2290, (2000)).

The desire of epitaxied structure manufacturers is to minimise these steps necessary for preparation of the substrate. This is the advantage of "epiready" substrates that can be entered into the epitaxy chamber directly without prior preparation. These particular substrates are covered with a protection layer that is removed in situ, thus revealing a perfectly clean surface for epitaxial growth.

Document [2], L. X. Zheng et al. Phys. Rev., B61, p. 4890 (2001), divulges that exposure of an SiC substrate with a {0001} structure to Gallium causes the formation of a continuous film of Gallium with a thickness of a monolayer on the SiC substrate. Therefore, if an SiC substrate is exposed to Gallium, it might be possible to obtain protection of the surface of the SiC substrate by a Ga layer. Moreover, knowing that the Ga oxide breaks down under the action of heat at about 600-650° C., which is below the nitride growth temperature, this type of protection layer can be evaporated in situ at the beginning of an epitaxy step after the said layer has been deliberately or accidentally oxidised during residence in air.

The problem is that since Ga is easily oxidised, it is also possible for SiC to be oxidised.

PRESENTATION OF THE INVENTION

The purpose of the invention is to provide protection of the surface of SiC substrates, that does not have the disadvantages of prior art. This purpose is achieved by a method of protecting the surface of an SiC substrate, characterised in that it includes the deposition of a temporary protection layer with a thickness equal to at least two monolayers on the surface of the substrate to be protected, the protection layer being composed of gallium nitride. The thickness of the temporary protection layer, equal to at least two monolayers, corresponds to approximately 0.5 nm.

The result is thus a method of protecting a surface of an SiC substrate that results in "epiready" SiC substrates.

Advantageously, the protection layer is deposited by Stranski-Krastanow epitaxy, the epitaxy being stopped before the appearance of islands. Remember that a Stranski-Krastanow epitaxy consists of growth of a few two-dimensional monolayers on the surface of a substrate, followed by a three-dimensional growth in the form of islands on the surface of the monolayers created. According to the invention, the Stranski-Krastanow epitaxy is advantageously done until a two-dimensional layer of GaN is formed on the surface of the support substrate, the growth of GaN being stopped before the appearance of islands. The result is thus a continuous two-dimensional layer, currently called a wetting layer. This layer is advantageously two monolayers thick. Thus, the wetting layer alone provides protection for the SiC surface.

According to one variant, the gallium nitride protection layer according to the invention is obtained by depositing a gallium layer on the surface of the substrate to be protected, followed by nitridation of the gallium layer thus formed. A Ga layer deposited on the surface of an SiC substrate can be nitrided to form a continuous layer of GaN, for example two monolayers thick, protecting the SiC surface.

Advantageously, the temporary protection layer made of gallium nitride is eliminated by vacuum evaporation. This protection layer is eliminated when epitaxy is to be done on the "epiready" substrate.

The invention also relates to an "epiready" substrate characterised in that it comprises an SiC substrate for which at least one surface is covered by a temporary protection layer, the said layer being composed of GaN and being two monolayers thick.

One of the advantages of the invention is that by using a GaN protection layer, oxygen diffusion as far as the SiC substrate can be limited, thus forming a more efficient protection than is possible with a Ga layer which oxidizes more easily.

DETAILED PRESENTATION OF PARTICULAR EMBODIMENTS

An "epiready" substrate prepared using the process according to the invention consists of covering an SiC substrate with two monolayers of GaN about 0.5 nm thick. The monolayers are obtained using the Stranski-Krastanow (SK) growth method that in this case consists of depositing a two-dimensional layer of GaN followed by creation of GaN islands. The protection layer is preferably deposited at a temperature between 700 and 800° C. in a vacuum chamber, and is stopped before islands appear. The result is then an "epiready" SiC substrate.

An SiC substrate covered by an ultra-thin GaN layer according to the process described above has the characteristics required to form an "epiready" substrate.

The user must then eliminate the temporary protection layer so that this "epiready" SiC substrate can be used, for example to make a nitride epitaxy. This temporary protection layer may possibly be evaporated by the substrate user under a vacuum after the protection layer has been oxidised. Since the Ga oxide (and also the GaN oxide) breaks down under the action of heat at about 600-650° C., and this temperature is less than the epitaxy temperature necessary for epitaxial growth of semi-conducting nitrides on an SiC substrate, the epitaxy will be done on a substrate from which its protection layer has been removed. Furthermore, the process according to the invention does not cause any pollution in the growth of nitrides since the protection layer is composed of materials that are themselves used during the epitaxy of nitrides on SiC.

BIBLIOGRAPHY

[1] K. H. PLOOG and al., J. Vac. Sci. Technol., B18(4), page 2290, (2000).
[2] L. X. Zheng and al., Phys. Rev., B61, page 4890, (2001).

The invention claimed is:

1. A process for protecting the surface of an SiC substrate, comprising deposition of a protection layer with a thickness equal to at least two monolayers on the surface of the substrate to be protected, the protection layer comprising gallium nitride, wherein deposition of the protection layer is made by a Stranski-Krastanow epitaxy, the epitaxy being stopped before the appearance of islands.

2. The process as claimed in claim 1, wherein said protection layer consists of gallium nitride.

3. The process as claimed in claim 1, wherein said protection layer consists of gallium nitride and has a thickness of about 0.5 nm.

4. The process as claimed in claim 1, wherein said protection layer consists of two monolayers of gallium nitride and has a thickness of about 0.5 nm.

5. The process as claimed in claim 1, wherein the protection layer consists of gallium nitride which has been deposited by a Stranski-Krastanow epitaxy at a temperature between 700 and 800° C., the epitaxy being stopped before the appearance of islands.

6. The process as claimed in claim 1, wherein said protection layer is removable.

7. A process for protecting the surface of an SiC substrate, comprising deposition of a removable protection layer with a thickness equal to at least two monolayers on the surface of the substrate to be protected, wherein the protection layer consists of gallium nitride which has been deposited by a Stranski-Krastanow epitaxy at a temperature between 700 and 800° C., the epitaxy being stopped before the appearance of islands.

8. A process for protecting the surface of an SiC substrate, comprising deposition of a protection layer with a thickness equal to at least two monolayers on the surface of the substrate to be protected, the protection layer comprising gallium nitride, wherein the protection layer is eliminated by vacuum evaporation.

9. The process as claimed in claim 8, wherein said protection layer consists of gallium nitride.

10. The process as claimed in claim 8, wherein said protection layer consists of gallium nitride and has a thickness of about 0.5 nm.

11. The process as claimed in claim 8, wherein said protection layer consists of two monolayers of gallium nitride and has a thickness of about 0.5 nm.

12. The process as claimed in claim 8, wherein the protection layer consists of gallium nitride which has been deposited by a Stranski-Krastanow epitaxy at a temperature between 700 and 800° C., the epitaxy being stopped before the appearance of islands.

* * * * *